United States Patent [19]

Cornelissen

[11] Patent Number: 4,864,159

[45] Date of Patent: Sep. 5, 1989

[54] ECL TO CMOS TRANSITION AMPLIFIER

[75] Inventor: Bernardus H. J. Cornelissen, Bergeijk, Netherlands

[73] Assignee: U.S. Philips Corporation, New York, N.Y.

[21] Appl. No.: 236,497

[22] Filed: Aug. 25, 1988

[30] Foreign Application Priority Data

Aug. 26, 1987 [GB] United Kingdom ............... 8720090

[51] Int. Cl.[4] .................... H03L 5/00; H03K 3/29; H03K 3/26; H03K 17/687
[52] U.S. Cl. .................................. 307/264; 307/279; 307/270; 307/272.2; 307/289; 307/475; 307/585
[58] Field of Search .......... 307/264, 279, 270, 272.2, 307/289, 475, 585

[56] References Cited

U.S. PATENT DOCUMENTS

| | | | |
|---|---|---|---|
| 4,039,862 | 8/1977 | Dingwall et al. | 307/264 |
| 4,150,308 | 4/1979 | Adlhoch | 307/264 |
| 4,161,663 | 7/1979 | Martinez | 307/264 |
| 4,191,898 | 3/1980 | Ulmer | 307/264 |
| 4,532,436 | 7/1985 | Bismarck | 307/585 |
| 4,656,374 | 4/1987 | Rapp | 307/585 |
| 4,695,744 | 9/1987 | Giordano | 307/264 |
| 4,798,972 | 1/1989 | Melanson et al. | 307/270 |
| 4,801,819 | 1/1989 | Theus et al. | 307/585 |
| 4,801,826 | 1/1989 | Cornelissen | 307/475 |

FOREIGN PATENT DOCUMENTS

1470565 4/1977 United Kingdom .

OTHER PUBLICATIONS

C. Mead and L. Conway, "Introduction to VLSI Systems", published by Addison-Wesly Publishing Company, pp. 20-21.

*Primary Examiner*—Stanley D. Miller
*Assistant Examiner*—Trong Q. Phan
*Attorney, Agent, or Firm*—Bernard Franzblau

[57] ABSTRACT

When processing logic signals in ECL and CMOS circuitry it is necessary to adjust the logic levels when going from one type of circuitry to another. A problem which occurs is that smearing of a logic level occurs due to poor rise and fall times in a level adjusting amplifier. The rise and fall times can be improved by the level adjusting amplifier load circuit comprising the series connection of the source-drain paths of first and second N-channel transistors (20, 22), the parasitic capacitance of the drain of the first transistor (20) at a node (23), and by connecting the gate of the second transistor (22) to the node. In operation, when the first transistor (20) is non-conductive and the node (23) is charged, the second transistor (22) is operating in the triode or linear region of its characteristic in spite of its gate being at the voltage of the node. When the first transistor (20) is rendered conductive then both transistors (20, 22) are fully conductive and the starting discharge current is high. An amplifier including a symmetrical load is disclosed in FIG. 4.

7 Claims, 2 Drawing Sheets

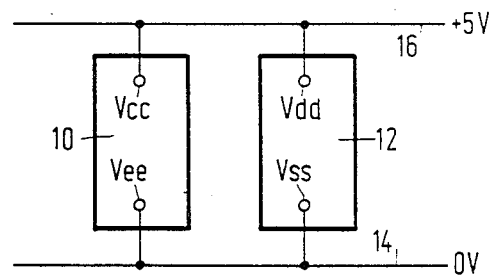
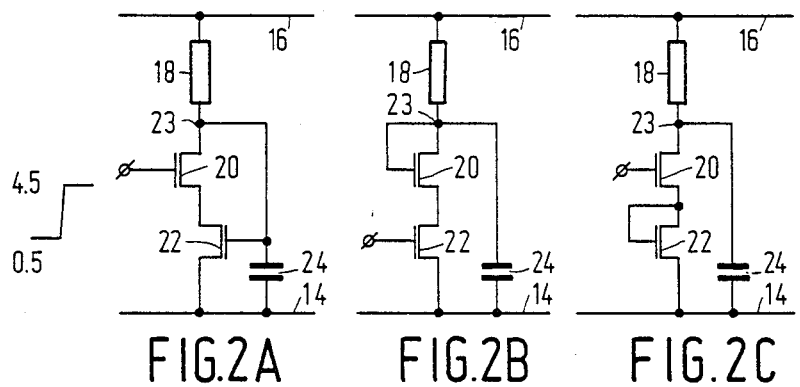
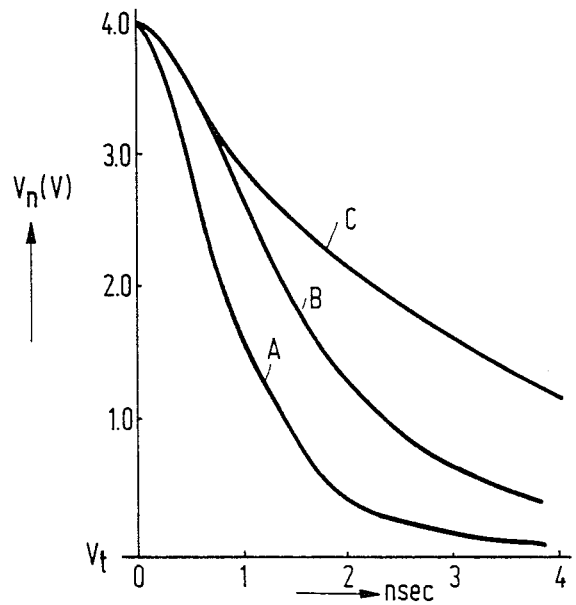

ECL TO CMOS TRANSITION AMPLIFIER

BACKGROUND OF THE INVENTION

The present invention relates to an amplifier load circuit which has particular but not exclusive application in an amplifier for adjusting the logic levels used in ECL logic to the logic levels used in CMOS logic.

ECL logic is able to operate at frequencies above 100 MHz and has logic levels of Vdd and (Vdd-400 mV) whereas CMOS logic operates at frequencies below 50 MHz and has logic levels of >(Vdd-500 mV) and <500 mV. Accordingly when providing both types of logic on a single chip and having one pair of power supply lines, say +5 volts and 0V, it is essential to be able to adjust the logic levels of one type of logic to suit the other type of logic. An amplifier is frequently used to adjust the logic levels. Generally the amplifier is of a balanced design with a symmetrical input and output. A criticism of the operation of such an amplifier is that although the output voltages are only slightly delayed with respect to the input signal, there is a poor rise and fall time. This latter effect manifests itself as a smearing of the output signals because they reach their final value only slowly.

SUMMARY OF THE INVENTION

It is an object of the present invention to mitigate this problem.

According to one aspect of the present invention there is provided a symmetrical amplifier load circuit comprising first and second parallel arranged branches coupled between first and second supply voltage lines, a first input circuit, a second input circuit, a first output voltage, and a second output stage, wherein the first branch comprises first and second field effect transistors (FETs) of similar conductivity type having gate, source and drain electrodes, the source-drain paths of the first and second transistors are connected in series with the drain of the first transistor coupled via the first input circuit to the first supply voltage line and the source of the second transistor coupled to the second supply voltage line, the parasitic capacitance of the drawn of the first transistor constitutes a first node, the gate of the second transistor is connected to the first node which is also connected to the first output stage, and wherein the second branch comprises third and fourth FETs of the same conductivity type as the first and second FETs and having gate, source and drain electrodes, the source-drain paths of the third and fourth FETs are connected in series with the drain of the third FET being coupled via the second input circuit to the first supply voltage line and the source of the fourth FET coupled to the second supply voltage line, the parasitic capacitance of the drain of the third FET constitutes a second node, the gate of the fourth FET is connected to the second node which is also connected to the second output stage, the drain of the third FET is connected to the gate of the first FET and the gate of the third FET is connected to the drain of the first FET.

An amplifier provided with such a symmetrical load ciricut has a small steady state current but a large transient switching current.

According to another aspect of the present invention there is provided an amplifier for adjusting logic levels used in ECL logic to logic levels used in CMOS logic, comprising first and second supply voltage lines, first and second parallel arranged branches extending between the supply voltage lines, the first branch comprising a first NPN transistor connected as an emitter follower having its collector electrode connected to the first supply voltage line, its base electrode connected to a first input signal source and its emitter electrode connected to the source of a first P-channel FET (P-FET) connected in common gate configuration, and first and second N-channel FETs (N-FET) having their source-drain paths connected in series between the drain of the first P-FET and the second supply voltage line, a junction of the drains of the first P-FET and the first N-FET constituting a first node, the second branch comprising a second NPN transistor connected as an emitter follower having its collector electrode connected to the first supply voltage line, its base electrode connected to a second input signal source and its emitter connected to the source of a second P-FET connected in common gate configuration, and third and fourth N-FETs having their source-drain paths connected in series between the drain of the second P-FET and the second supply voltage line, a junction of the drain of the second P-FET and the third N-FET constituting a second node, a first output stage comprising a third P-FET in grounded gate configuration having its source-drain path connected in series with that of a fifth N-FET between the emitter of the first NPN transistor and the second supply voltage line, and a second output stage comprising a fourth P-FET in DC-biased gate configuration having its source-drain path connected in series with that of a sixth N-FET between the emitter of the second NPN transistor and the second supply voltage line, the gate electrodes of the second, third and sixth N-FETs being connected to the first node, the gate electrodes of the first, fourth and fifth N-FETs being connected to the second node, and the gates of the first, second, third and fourth P-FETs being connected to a bias voltage supply.

It is already known from the British Pat. No. 1,470,565 that in a differential amplifier a higher amplification can be obtained by a positive feedback from the gate of the second N-FET to the drain of the first N-FET. However, the combination of the first and third crosscoupled N-FET performing a latch function and the second and fourth NFET provide a high switching speed and low static power dissipation. These features can not be deduced from the circuit shown in the British Patent cited above.

BRIEF DESCRIPTION OF THE DRAWING

The present invention will now be explained and described, by way of example, with reference to the accompanying drawings; wherein:

FIG. 1 is a block schematic diagram of the connection of ECL logic and CMOS logic to a single power supply, FIGS. 2a, 2b and 2c show three load circuits, FIG. 3 are three graphs A, B and C showing the change in node voltage ($V_n$) with respect to time of the load circuits shown in FIGS. 2A, 2B and 2C in response to a change in logic level.

DESCRIPTION OF THE PREFERRED EMBODIMENTS

Figure 4:
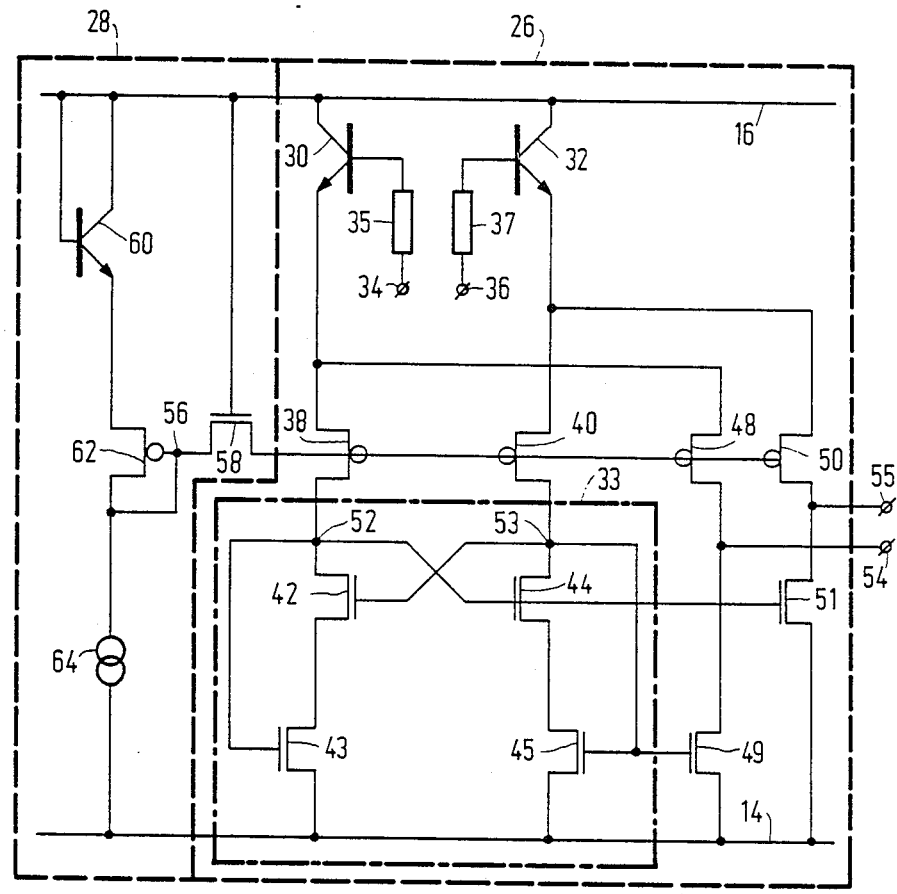
FIG. 4 is a schematic circuit diagram in accordance with the invention showing on the right a symmetrical amplifier for converting ECL logic levels to CMOS logic levels and on the left a bias voltage supply circuit.

In the drawings corresponding reference numerals have been used to indicate the same elements.

FIG. 1 shows the connection of ECL and CMOS circuits 10, 12, respectively, between the same supply lines 14 and 16 at 0V and +5V, respectively. As the logic levels of ECL are: Vdd and (Vdd-400 mV) and for CMOS: >(Vdd-500 mV) and <500 mV and amplifier is required to connect the output ECL logic levels to the input CMOS logic levels. In order to adjust the ECL logic levels to the CMOS logic levels the amplifier, which in the embodiment of FIG. 4 comprises a symmetrical amplifier, should be able to respond promptly to the input signal and provide an output free from smearing. Smearing arises due to the output signals reaching their final value only slowly.

It has been realised that the effects of smearing can be reduced by having an amplifier load circuit which can respond quickly, within 4 nsec., to the change in the input signal.

FIGS. 2A, 2B and 2C illustrate simulations of three different load circuits. Each of the illustrated load circuits comprises two N-channel enhancement field effect transistors 20, 22, the sourcedrain paths of which are connected in series, with the drain of the transistor 22 being connected to the source of the transistor 20. When simulating the circuit shown in FIG. 2A CMOS logic levels are applied to the gate of the transistor 20. The gate of the transistor 22 is connected to anode 23 at the drain of the transistor 20. The parasitic capacitance of the node 23 is represented by a capacitor 24. For the purpose of circuit simulation a resistor 18 is connected between the node 23 and the supply voltage line 16 to enable the charge on the capacitor 24 to have the correct starting value.

Referring now to FIGS. 2B and 2C, the similarities to FIG. 2A are that the source-drain paths of the N-channel enhancement field effect transistors 20, 22 are connected in series and the parasitic capacitance at the node 23 is represented by the capacitor 24. However, unlike FIG. 2A one transistor in FIGS. 2B and 2C, namely the transistor 20 in FIG. 2B and the transistor 22 in FIG. 2C, is connected as a diode. The significance of this difference becomes apparent when the operation of FIG. 2A is contrasted with the operation of FIGS. 2B and 2C.

In FIG. 2A, it is assumed that the capacitance (24) at the node 23 is charged to 5 Volts, the lines 14 and 16 being at 0 Volts and 5 Volts respectively, and has to be discharged to a voltage equal to or slightly greater than the threshold of an N-channel transistor (or N-FET). Although the voltage at the gate of the transistor 22 exceeds the threshold voltage it is cut-off on its drain by the fact that the transistor 20 is non-conductive and there is no current. However, when the signal on the gate of the transistor 20 changes turning this transistor on, both the transistors 20 and 22 are fully conducting producing a high starting current which rapidly discharges the capacitor 24. The discharge continues until the voltage on the gate of the transistor 22 is substantially equal to the threshold voltage of an N-FET.

The circuits of FIGS. 2B and 2C are slower because of using an MOS diode which is cut-off on the gate and in consequence its gate-source voltage will be at or just below the threshold. This problem is recognised in the art, for example "Introduction to VLSI Systems" by C. Mead and L. Conway, published by Addison-Wesley Publishing Company, pages 20 and 21, because when discharging a capacitor with an MOS-diode as the gate-source voltage gets closer and closer to the threshold, the amount of current provided by the enhancement transistor decreases rapidly.

FIG. 3 comprises graphs showing the response of the three load circuits to a change in the input signal. The curves A, B and C refer to the respective load circuits shown in FIGS. 2A, 2B and 2C. The abscissa represents time and is scaled in nonoseconds and the ordinate represents the node voltage ($V_n$) and is scaled in volts, the threshold voltage $V_t$ being the minimum voltage. It is evident that the response of the load circuit of FIG. 2A is much faster than the circuits of FIGS. 2B and 2C.

Referring now to FIG. 4, the illustrated circuit comprises two main parts: an amplifier 26 and a reference generator 28. The amplifier 26 is a symmetrical amplifier and comprises an input stage formed by NPN transistors 30, 32 connected as emitter followers with their collectors connected to the supply line 16 and their emitters coupled to a symmetrical load 33. Symmetrical input drive signals on input terminals 24, 36 are applied to the base electrodes of the transistors 30, 32 respectively. For the sake of circuit simulation the internal resistance of the drive signals is represented by resistors 35, 37. The transistors 30, 32 control DC-biased gate P-channel FETs 38, 40. The source-drain paths of these P-FETs are connected in series between the emitters of the transistors 30, 32 and the load 33 with the input signals being applied to the sources of the P-FETs 38, 40. The load 33 comprises N-channel FETs 42, 43, 44 and 45 connected as a flip-flop. More particularly the source-drain paths of the FETs 42, 43 and the FETs 44, 45 are connected in series and each series chain is connected between the respective P-FETs 38, 40 and the supply line 14. The junctions of the drains of the FETs 38, 42 and 40, 44 comprise nodes 52, 53, respectively, which comprise parasitic capacitances. The gates of the N-FETs 43 and 45 are connected to their respective nodes 52, 53. The gates of the N-FETs 42, 44 are cross-connected with the nodes 53, 52 respectively. One result of the described interconnection of the N-FETs 42 to 45 is that N-FETs 42, 45 form a current mirror as do the N-FETs 44, 43. Thus, the current in each branch will be equal. In the non-switching situation when the circuit is at rest, then one of the two inputs 34, 36 will be high and the other low so that one of these two current mirror circuits will be active maintaining a small steady state current.

An output stage of the amplifier 26 comprises two symmetrical paths each comprising a DC-biased gate P-channel FET 48, 50 whose source-drain path is connected in series with the source-drain path of an N-channel FET 49, 51 respectively. The gate electrodes of the N-FETs 49, 51 are connected to the nodes 53, 52, respectively, in the load circuit. The gate-source capacitance of the N-FETs 49, 51 is connected between the gates of the N-FETs 45, 43, respectively, and the supply line 14. The source-drain paths of the P-FETs 48, 50 are connected to the emitter circuits of the transistors 30, 32. The amplifier outputs comprising symmetrical signals at CMOS logic levels are derived from output terminals 54, 55. By means of such an output stage a rising edge at the output termminal 54 (or 55) is controlled by transistors 30, 48 (or 32, 50) and a falling edge at the respective output terminal is controlled by the transistor 49 (or 51).

The operation of the amplifier 26 will now be described by assuming that the input 34 goes from low to high and the input 36 goes from high to low. The capacitance of the node 52 will be charged-up and that of the node 53 will be discharged. Consequently the transient behaviour will be that the N-FETs 44, 45 will be rendered conductive and cause the node 53 to discharge. In this situation the N-FET 45 is effectively an MOS diode maintaining a voltage greater than the threshold voltage on the N-FET 44.

Simultaneously the low voltage at the node 53 will cause the N-FET 42 to operate at minimum current thereby forcing the N-FET 43 to operate in the linear (or triode) region of its characteristic. As the source of the P-FET 48 goes high, this P-FET 48 is conductive, while simultaneously the P-FET 50 is operated at minimum current. The gate of the N-FET 49 goes low biassing this transistor at minimum current causing the output 54 to go high, that is, towards the voltage on the line 16. Conversely the gate of the N-FET 51 goes high rendering it conductive thereby causing the output 55 to go low, that is, towards the voltage on the line 14, for example 0V.

The reverse situation applies when the signals at the inputs 34, 36 change back.

When determining the operating characteristics of the amplifier 26 various factors have to be taken into account. These factors include the fact that the load 33 should never be switched off completely thereby avoiding the situation where the minimum current through the NPN transistors 30, 32 is too low. This may be illustrated by assuming that the bipolar transistors 30, 32 having a driving signal at their bases with a magnitude of 400 mV. Assuming the output signals at their emitters are $\frac{2}{3} \times 400$ mV, there remains a driving voltage between their bases and emitters of $\frac{1}{3} \times 400$ mV (or 130 mV). This means that the ratio between maximum and minimum current will be exp. $(0.13/(KT/q))$ which is approximately equal to 150. So in a steady state a minimum current has to be maintained through the NPN transistors 30, 32 so that the FETs, which constitute the load, are never cut-off completely. Typically the steady state current is adjusted to 10 $\mu$A.

Another factor is that the input-output characteristic of the amplifier 26 is mainly determined by the P-FETs 38, 40. The gain (or beta) of these P-FET transistors 38, 40 in common gate configuration is 4/3 times the gain of such transistors when in a common source configuration. This increase results from the occurring backgate control of the P-FETs 38, 40. The back-gates (N-wells) of the P-FETs 38, 40 are connected to the line 16 which is at Vdd. The influence of the drain voltage on the current (gamma) is $\frac{2}{3}$ of the reaction in the P transistor if it was gate-controlled. As the maximum attainable voltage gain of the amplifier circuit is 30 to 40 times, a desired gain factor of 10 can be attained easily.

In view of the fact that the P-FETs 38 and 40 together with the P-FETs 48, 50 are operated in a DC-biased gate configuration, it is important that they have a stable bias. It is not practical to drive the gates of the P-FETs 48, 50 from the voltages at the nodes 52, 53 because their "low" levels can be as high as 2 volts. Assuming a supply voltage of the order of 4.5 volts then the peak to peak values of the signals at the nodes 52, 53 are (4.25-1.5) volts, that is 2.75 volts.

By way of illustration, the voltage levels in the amplifier circuit will be given for a nominal case of a Vdd (line 16) of 5 volts. If the signal voltages on inputs 34, 36 are 4.6 volts and 5.0 volts respectively, then the voltages at the emitters of the transistors 30, 32 are 3.9 volts and 4.3 volts, respectively. The nodes 53 and 52 are at 4.2 volts and 1.4 volts respectively and the common connection between the source-drain paths of the N-FETs 42, 43 and 44, 45 are 0.1 volt and 2.0 volts, respectively.

If now the input voltage on the input 34 increases from 4.6 volts to 5.0 volts and that on the input 36 decreases from 5.0 volts to 4.6 volts, the current in the left hand branch increases considerably temporarily, namely to more than 100 $\mu$A, the flip-flop in the load 33 changes state, and in the quiescent state both branches convey 10 $\mu$A again. The voltages at the nodes 52, 53 vary between 1.4 and 4.2 volts. The presence of the output stage enables the amplifier 26 to have a good low level and also good rise and fall times, the latter being due the gates of the N-FET transistors 43, 45 being connected to the nodes 52, 53, respectively, thereby enabling their parasitic capacitances to be discharged rapidly as described with reference to FIG. 2A. The high level is marginal, namely (Vdd-Vj-0.1) volts. Since the threshold voltage of a P-channel FET is higher than (Vj+0.1) volt, this level is acceptable.

When implementing the amplifier 26 in a chip, the P-FETs 38, 40 are 48 $\mu$m wide and the P-FETs 48, 50 are 72 $\mu$m wide. These wide transistors cause the quiescent state adjustment to the reference voltages at an output 56 of the reference generator 28 to be very sensitive. The output 56 can be directly connected to the P-FETs 38, 40, 48 and 50. However, if the output 56 is used for more than one amplifier it is expedient to provide a grounded gate N-FET 58 in order to prevent transients produced by an amplifier from reaching the reference voltage generator 28.

The reference generator 28 itself comprises a diode connected NPN transistor 60 whose collector and base electrodes are connected to the supply line 16. The emitter electrode of the transistor is connected in series with the source-drain path of diode connected P-FET 62. The drain/gate connection of the P-FET 62 is connected to the output 56 and to a reference constant current source 64.

In operation whichever one of the transistors 30, 32 is active due to the input 34 or 36 being high, that is at a voltage of the order of that of the supply line 16, it mirrors the current in the path formed by the transistor 60, P-FET 62 and the current source 64. In consequence the current is independent of variations in temperature, supply voltage and process variables.

From reading the present disclosure, other modifications will be apparent to persons skilled in the art. Such modifications may involve other features which are already known in the design, manufacture and use of logic systems and amplifiers and component parts thereof and which may be used instead of or in addition to the features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim andn whether or not it mitigates any or all of the same technical problems as does the present invention.

What is claimed is:

1. A symmetrical amplifier load circuit comprising first and second parallel arranged branches coupled between first and second supply voltage lines, a first input circuit, a second input circuit, a first output stage, and a seocnd output stage, wherein the first branch comprises first and second field effect transistors (FETs) of similar conductivity type having gate, source and drain electrodes, the source-drain paths of the first and second field effect transistors being connected in series and with the drain of the first field effect transistor coupled via the first input circuit to the first supply voltage line and the source of the second field effect transistor coupled to the second supply voltage line, a parasitic capacitance of the drain of the first field effect transistor providing a first node, the gate of the second field effect transistor being connected to the first node which is also connected to the first output stage, and wherein the second branch comprises third and fourth FETs of the same conductivity type as the first and second FETs and having gate, source and drain electrodes, the source-drain paths of the third and fourth FETs being connected in series and with the drain of the third field effect transistor coupled via the second input circuit to the first supply voltage line and the source of the fourth FET coupled to the second supply voltage line, a parasitic capacitance of the drain of the third FET providing a second node, the gate of the fourth FET being connected to the second node which is also connected to the second output stage, the drain of the third FET being connected to the gate of the first FET and the gate of the third FET being connected to the drain of the first FET.

2. A circuit as claimed in claim 1, wherein the first, second, third and fourth FETs are N-FETs.

3. A circuit as claimed in claim 2, wherein the first and second input circuits comprise first and second emitter follower circuits, respectively.

4. A circuit as claimed in claim 1, wherein the first and second input circuits comprise first and second emitter follower circuits, respectively.

5. A circuit as claimed in claim 4, wherein a first P-FET has its source-drain path connected between the emitter of the first emitter follower and the first node and a second P-FET has its sourcedrain path connected between the emitter of the second emitter follower and the second node.

6. An amplifier for adjusting logic levels used in ECL logic to logic levels used in CMOS logic, comprising first and second parallel arranged branches coupled between first and second supply voltage lines, the first branch comprising a first NPN transistor connected as an emitter follower having its collector electrode connected to the first supply voltage line, its base electrode connected to a first input signal source and its emitter electrode connected to the source of a first P-channel FET (P-FET) connected in common gate configuration, and first and second N-channel FETs (N-FET) having their source-drain paths connected in series between a drain of the first P-FET and the second supply voltage line, a junction of the drains of the first P-FET and the first N-FET constituting a first node, the second branch comprising a second NPN transistor connected as an emitter follower having its collector electrode connected to the first supply voltage line, its base electrode connected to a second input signal source and its emitter connected to the source of a second P-FET connected in common gate configuration, and third and fourth N-FETs having their source-drain paths connected in series between a drain of the second P-FET and the second supply voltage line, a junction of the drains of the second P-FET and the third N-FEt constituting a second node, a first output stage comprising a third P-FET in DC-biased gate configuration having its source-drain path connected in series with that of a fifth N-FET between the emitter of the first NPN transistor and the second supply voltage line, and a second output stage comprising a fourth P-FET in DC-biased gate configuration having its source-drain path connected in series with that of a sixth N-FET between the emitter of the second NPN transistor and the second supply voltage line, the gate electrodes of the second, third and sixth N-FETs being connected to the first node, the gate electrodes of the first, fourth and fifth N-FETs being connected to the second node, and the gates of the first, second, third and fourth P-FETs being connected to a bias voltage supply.

7. An amplifier as claimed in claim 6, wherein back-gates of the first and second P-FETs are connected to the first supply voltage line.

* * * * *